United States Patent [19]
Chen

[11] Patent Number: 5,907,258
[45] Date of Patent: May 25, 1999

[54] FULLY INTEGRATED TWO AXIS SHOCK DETECTOR

[75] Inventor: Ching-Siang Chen, Laguna Niguel, Calif.

[73] Assignee: Texas Instruments Incorporated, Dallas, Tex.

[21] Appl. No.: 08/634,098

[22] Filed: Apr. 17, 1996

[51] Int. Cl.[6] ............................................. H04B 1/10
[52] U.S. Cl. ........................... 327/557; 327/343; 327/339
[58] Field of Search .................................. 327/531, 532, 327/339, 343, 330, 551–559; 341/143

[56] References Cited

U.S. PATENT DOCUMENTS

| | | | |
|---|---|---|---|
| 3,605,029 | 9/1971 | Freedman | 327/557 |
| 3,614,637 | 10/1971 | Kubanoff | 327/557 |
| 4,212,205 | 7/1980 | West et al. | 73/579 |
| 4,250,453 | 2/1981 | Nilsson | 327/557 |
| 4,357,549 | 11/1982 | Miller | 327/557 |
| 4,358,738 | 11/1982 | Kahn | 327/557 |
| 5,053,725 | 10/1991 | Gesche et al. | 333/17.3 |
| 5,541,953 | 7/1996 | Hiben et al. | 327/557 |

*Primary Examiner*—Timothy P. Callahan
*Assistant Examiner*—My-Trang Nu Ton
*Attorney, Agent, or Firm*—W. Daniel Swayze, Jr.; W. James Brady, III; Richard L. Donaldson

[57] ABSTRACT

The present invention discloses a fully integrated precision HDA shock sense circuit with high-order filters implemented in integrated circuit technology. Filters are integrated with an improved on-chip bias generator so that they can provide stable, trimmable and/or programmable frequency responses with a minimum number of external capacitors. The invention provides dual full-wave rectifiers for X-axis and Y-axis shock sensing so that more accurate and reliable shock detection can be achieved. Input signals from X-axis and Y-axis shock sensors are converted to current and provided to the dual full-wave rectifiers. The currents thus full-wave rectified are summed and lowpass filtered to generate an output signal, which is then fed to a comparator to produce a shock detection logic signal.

17 Claims, 10 Drawing Sheets

AMPLIFIER 40'

AMPLIFIER 40"

FULLY INTEGRATED TWO AXIS SHOCK DETECTOR

BACKGROUND OF THE INVENTION

1. Field of the Invention

The present invention relates to the field of motion sensing in electromechanical assemblies and machines. More particularly, the invention relates to shock sensing in the field of Hard Drive Assembly (HDA), such as hard disk drives used in computer magnetic recording apparatus.

2. Background Art

As portable personal computers (PCs) such as laptop and notebook-sized computers become ubiquitous, it has become important for HDA designers to identify and eliminate the portable PCs' most common failure causes to improve their reliability. Generally, portable computers are subject to some types of failure which would not be a problem for desk top machines. For example, portable computers can be dropped while being carried or worked on, and components in the portable system can be damaged or crippled. One of the leading failure causes for portable PCs is in the fragility of the disk drive and its shock vulnerability.

Hard disks play an important part in delivering the same power and functionality of desk top computers for portable personal computers. In disk drives, a typical Hard Drive Assembly (HDA) comprises one or more rotatably mounted disks having an extremely thin magnetic coating deposited on the disk substrate. Information is generally read and written from the hard disks by a read/write head. An HDA typically has a very sensitive architecture wherein a very small gap is maintained between the drive head and the disk, and this makes the HDA especially vulnerable to shock damage. Since the smaller this gap is, the more data a hard disk can store, small gap dimensions are the norm for the hard disks.

Thus, in disk drive applications, it is important to protect Hard Drive Assembly (HDA) from environmental shocks and hazards. Disk manufacturers understand this problem and usually deal with it by shock mounting the HDA. Still, physical or mechanical impact can destroy the data integrity or hardware integrity of a hard disk. For example, when excessive shocks severely damage or cripple hard disk drives, users are at potential risk of not only having to replace the damaged drives but also losing valuable database.

Whenever excessive shocks occur, therefore, writing to disk drives must be prohibited to maintain data integrity on drives and prevent any damages to the drives. A shock detector can be used for this purpose to sense and detect excessive shocks, and signal an embedded microprocessor to stop writing on disk drives.

Traditionally, the HDA shock detector is implemented with discrete components including resistor and capacitor components. However, using a number of discrete components not only compromises the performance of detection circuitry for cost, but also takes a fair amount of board space to accommodate discrete components. A bulkier board usually increases costs due to various factors such as higher board cost and packaging cost. A bulkier size could also mean that there is a greater possibility in the system that some components would fail, and thus less overall system reliability.

Prior art RC-active filters also do not achieve steep attenuation of the input signals below the half-power or −3 dB frequencies. FIG. 1 shows a typical prior art front-end filter implemented by using discrete components. The filter has two real poles and one transmission zero at zero frequency. Shock sensor 101 and resistor 103 of 10 MΩ are coupled in parallel via capacitor 105 to the positive input terminal of amplifier 115. The positive input terminal of amplifier 115 is also coupled via resistor 107 and bypass capacitor 109 to a circuit reference point such as circuit ground. Capacitor 119 and resistor 117 are coupled between the output terminal of amplifier 115 and the negative input terminal of amplifier 115 in parallel. The negative input terminal of amplifier 115 is also coupled via resistor 111 and bypass capacitor 113 to a circuit reference point such as circuit ground.

In FIG. 1, the capacitor 105 provides AC-coupling for the shock signal input and blocks out DC component. The filter circuit shown in FIG. 1 provides sufficient rejection on DC component and a gain boost in the passband. But the rejection on high-frequency components is not acceptable for most HDA applications. To overcome this deficiency requires a higher-order filter, which can provide better high-frequency response characteristics. However, this increases the cost and the board space.

Further, RC-active circuits utilizing operational amplifiers with resistors and capacitors show unstable frequency response characteristics because the filter characteristics are dependent on resistor and capacitor values. To compound the problem, typical shock filter characteristics require large-value resistors and capacitors to realize low-frequency poles and zeros, which in turn occupy relatively large silicon space in integrated circuit technology. Thus, prior art RC-active circuits are not suitable for monolithic integration using, for example, CMOS technology, thereby making it difficult to scale down the system.

Furthermore, most prior art shock detectors are designed to detect only one-axis shock for the sake of simplicity and low cost. While this method is satisfactory for some applications, often it is not adequate or sufficient to detect and compensate for excessive shocks and protect the hard disk drives. A one-axis shock detector, for example, will not have a complete shock detection since shock signal is detected only along one axis, and consequently will result in less accurate sensing of actual physical or mechanical shock than desired. While less accurate shock sensing might be tolerable for desk top computers and work stations, they can often cause critical damage or crippling effect for many portable personal computers such as laptop computers.

However, if one were to design a two-axis shock detection system to provide more accurate sensing using prior art discrete component system, it would require even bigger board space and the compact size would have to be traded off for accuracy. FIG. 2 shows a conventional full-wave rectifier with summer and LPF implemented by discrete components. Referring to FIG. 2, input signal VINx is coupled to X-axis full-wave rectifier 211, which is coupled to summer 215 through resistor 219. The output of summer 215 is coupled to LPF217, which outputs to Vout. VINy is coupled to Y-axis full-wave rectifier 213, which is also coupled to summer 215 through resistor 221.

Shock signals from two-axis need to be full-wave rectified individually prior to being added together since the shock can be in either positive or negative direction of either axis. As shown in FIG. 2, conventionally, two diodes are used to rectify the current in one direction. Not only is the approach unsuitable for CMOS implementation, but also requires a fair amount of silicon area. As discussed, a bulky design adds to costs and is not suitable for portable computer applications.

Thus, there is a need in the art to overcome the shortcomings of the prior art HDA shock detector and provide a shock detector that can be fabricated in compact size by monolithic integration technology and still deliver an improved and reliable shock sensing capability. The present invention provides such fully integrated design for a two-axis HDA shock detector.

SUMMARY OF THE INVENTION

The present invention discloses a fully integrated shock detector with high-order filters, implemented in integrated circuit technology. Filters are integrated with an improved on-chip bias generator so that they can provide stable, trimmable and/or programmable frequency responses with a minimum number of external capacitors. Resistor elements are implemented with MOSFETs (Metal Oxide Semiconductor Field Effect Transistors), which are properly biased by an on-chip bias generator. The invention also provides an improved full-wave rectifier, a summer that sums signals from X-axis and Y-axis shock sensors, and an on-chip lowpass filter.

The full-wave rectifier is implemented using an integrated circuit technology and comprises an operational amplifier. The invention provides dual full-wave rectifiers for X-axis and Y-axis shock sensing so that more accurate and reliable shock detection can be achieved. Input signals from X-axis and Y-axis shock sensors are converted to current and provided to the dual full-wave rectifiers. The currents thus full-wave rectified are summed and lowpass filtered to generate an output signal, which is then fed to a comparator to produce a shock detection signal. Since the invention integrates most of its system in monolithic circuitry and requires only a few external components, it is feasible and desirable to house the whole detection circuitry with piezoceramic sensors in one package, thus reducing cost and board space.

DETAILED DESCRIPTION OF THE PRESENT INVENTION

A precision HDA shock sense circuit is described. In the following description, numerous specific details are set forth in order to provide a more thorough understanding of the present invention. It will be apparent, however, to one skilled in the art, that the present invention may be practiced without these specific details. In other instances, well known features have not been described in detail so as not to obscure the present invention.

Figure 3:
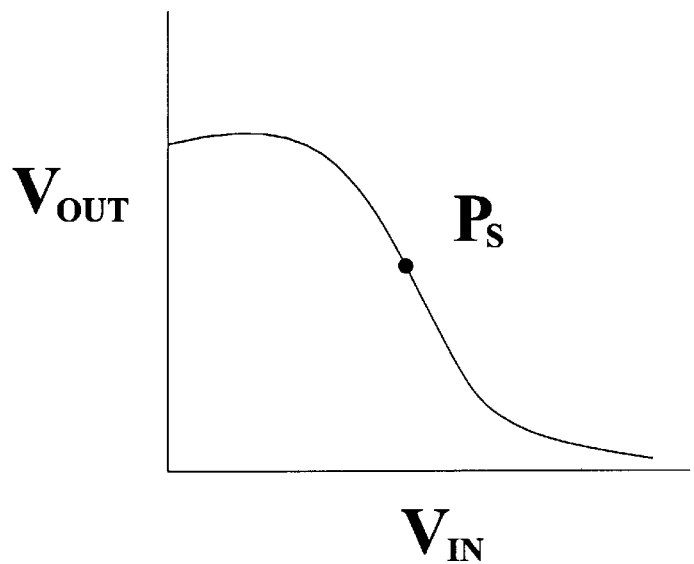
FIG. 3 shows a functional block diagram of a two-axis shock detector circuit according to the present invention.

FIG. 3 shows a functional block diagram of a two-axis shock detector circuit according to the present invention. Shock sensors 301 and 307 are implemented by piezoceramic elements mounted on an HDA. In response to environmental shocks to the HDA, shock sensors 301 and 307 generate small AC signals (typically, 0.5 millivolt/G) whose amplitudes are proportional to the magnitude of shocks. The AC signals from the sensors are first provided to bandpass filters 313 and 317 to be bandlimited. The bandlimited signals are then full-wave-rectified by full-wave rectifiers 315 and 319 and summed together by summing circuit 321.

The output of summing circuit 321 is then provided to a lowpass filter 323 to cut off its high-frequency components resulting from full-wave rectification. A comparator 325 with a small amount of hysteresis compares the filtered signal with a threshold Vth and generates a logic signal SD, which signals that the HDA has suffered a shock whose magnitude is above a predetermined threshold value. The system bounded by dotted lines 300 in FIG. 3 denotes a circuit integration comprising bandpass filters 313 and 317, full-wave rectifiers 315 and 319, summing circuit 321, lowpass filter 323 and comparator 325. Thus the logic signal SD is generated on block 300 and provided on an output pin to the external world.

Key requirements for front-end bandpass filters such as 313 and 317 of FIG. 3 include: sufficient rejections on both DC and high-frequency components around 20 KHz; a gain boost for signals from 1 KHz to 2.5 KHz. Its ideal frequency response is depicted in FIG. 4, and its practical frequency response characteristics in FIG. 5.

Figure 4:
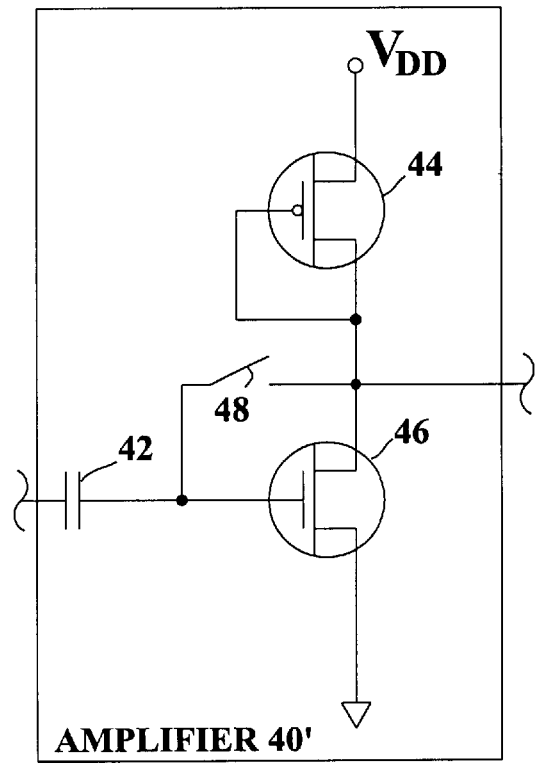
FIG. 4 shows frequency response for an ideal front-end band pass filter.
Figure 5:
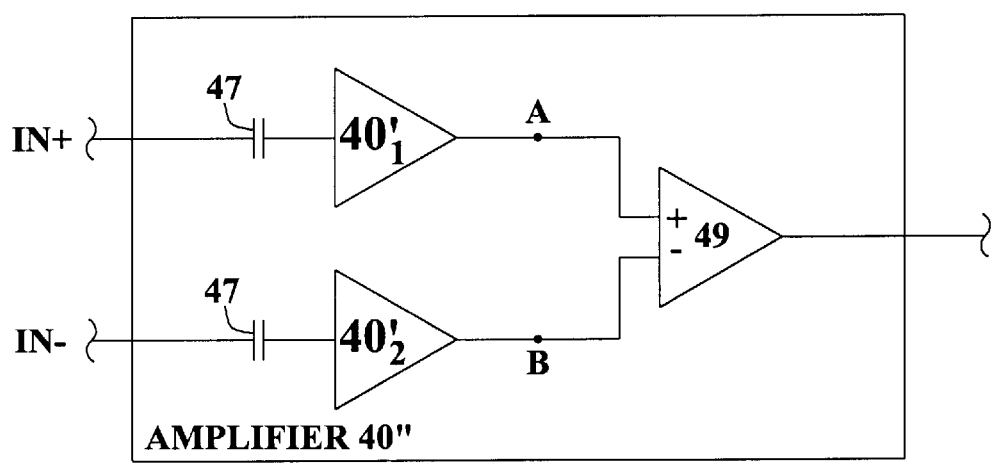
FIGS. 5 shows frequency response for a practical front-end band pass filter.

In FIG. 4, it is shown that an ideal bandpass filter used in system 300 would have a constant gain in the bandpass between two cutoff frequencies of 1 KHz and 2.5 KHz, and the frequency response is attenuated beyond the bandpass at lower and higher frequencies. For practical bandpass filters, the frequency response looks more similar to that of FIG. 5 wherein the gain is approximately constant in the bandpass of 1 KHz and 2.5 KHz.

Figure 6:
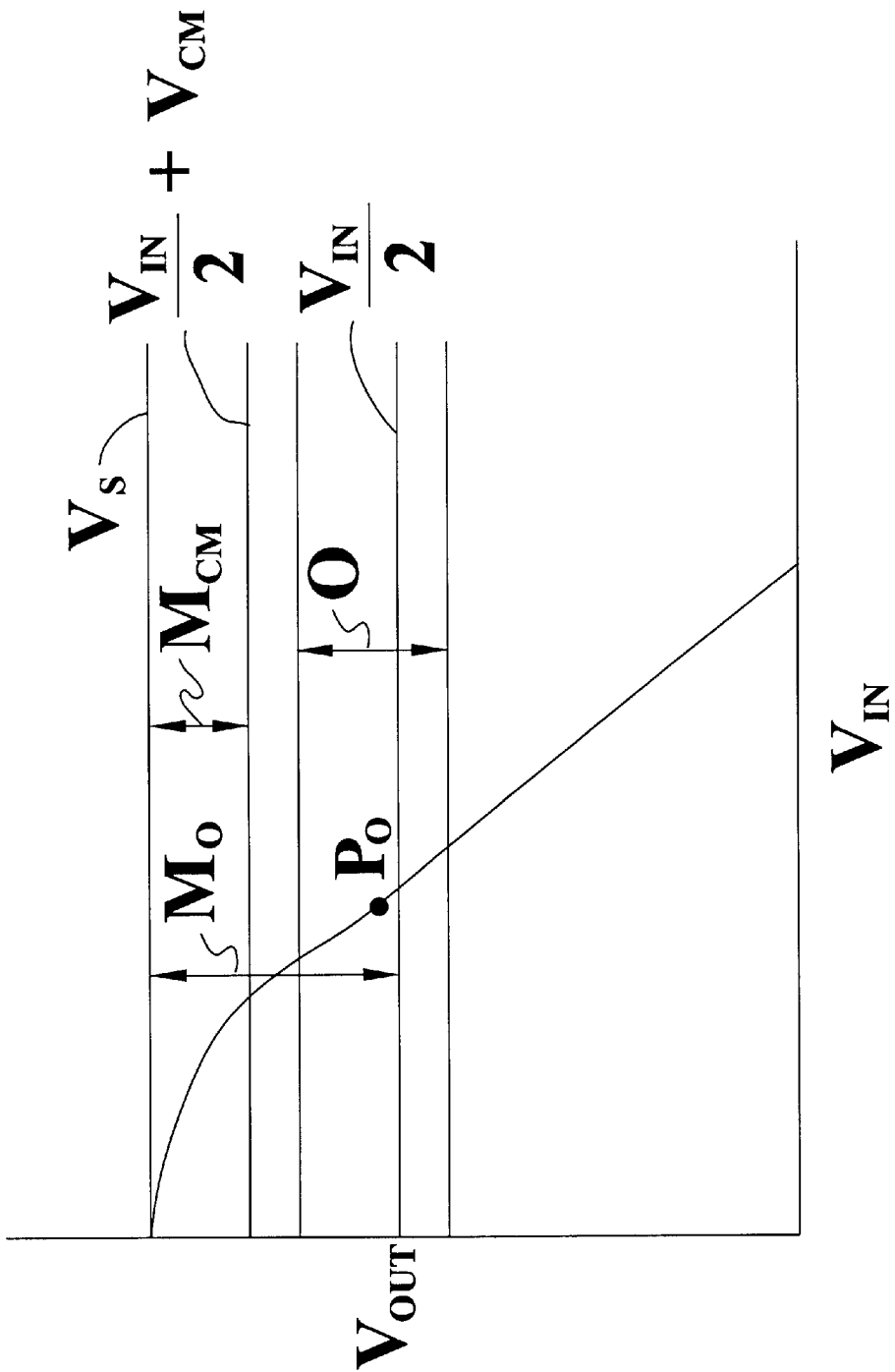
FIG. 6 shows a preferred embodiment of a bandpass filter according to the present invention.

FIG. 6 shows a preferred embodiment of the invented bandpass filter. The bandpass filter is realized by a highpass filter (HPF) 600 cascaded with a lowpass filter (LPF) 602. In FIG. 6, shock sensor 601 is coupled to an external capacitor 603 (capacitance value of C1), which is coupled to the positive input terminal of amplifier 606. The positive input terminal of amplifier 606 is also coupled to reference voltage $V_R$ through an external resistor 605 (resistance value of R1). On-chip resistor 609 (resistance value of R2) and an external capacitor 611 (capacitance value of C2) are coupled in series between reference voltage $V_R$ and the negative input terminal of the amplifier 606. An on-chip feedback resistor 607 (resistance value of R3) is coupled between the negative input terminal and output terminal of the amplifier 606.

The output terminal of the amplifier 606 is coupled to resistor 613 (resistance value of R4), which is coupled to node 623. Node 623 is coupled to the negative input terminal of the amplifier 620 through resistor 619 (resistance value of R5). Node 623 is coupled to a circuit reference point such as circuit ground through capacitor 615 (capacitance value of C3). The positive input terminal of the amplifier 620 is coupled to a circuit reference point such as circuit ground. The output terminal of the amplifier 620 is coupled to the negative input terminal of the amplifier 620 through capacitor 621 (capacitance value of C4), and coupled to node 623 through resistor 617 (resistance value of R6).

The non-inverting amplifier 606 plus on-chip resistors 607 and 609 in conjunction with external components 603, 605 and 611 form RC-active highpass filter (HPF) 600 whose transfer function is derived as follows:

$$H(s) = \left[\frac{sR1C1}{1+sR1C1}\right]\left[\frac{1+s(R2+R3)C2}{1+sR2C2}\right]$$

Capacitor 603 and resistor 605 in the first part of HPF transfer function realize one transmission zero at zero frequency and one pole at less than 1 Hz. Capacitor 603 is used to provide AC-coupling for the shock signal input and thus block out DC component of the shock signal. Resistor 605 is used to bias the shock signal at a reference voltage $V_R$. Resistors 607, 609 and capacitor 611 in the second part of HPF transfer function realize one transmission zero around 100 Hz and one pole around 1 KHz. For high frequencies, HPF provides a gain of $$\frac{(R_2+R_3)}{R_2}.$$

The inverting amplifier 620 with on-chip resistors 613, 617, 619 and capacitors 615, 621 forms RC-active lowpass filter 602 whose transfer function is derived as follows:

$$H(s)_{LPF} = \frac{-(R6/R4)}{1+sR5C4[1+(R6/R4)+(R6/R5)]+s^2R5R6C3C4}$$

The RC components realize two complex-conjugate poles with −3 dB frequency around 3 KHz and quality factor at Q=0.6. For low frequencies, LPF provides a gain of ($R_6/R_4$).

Figure 1:
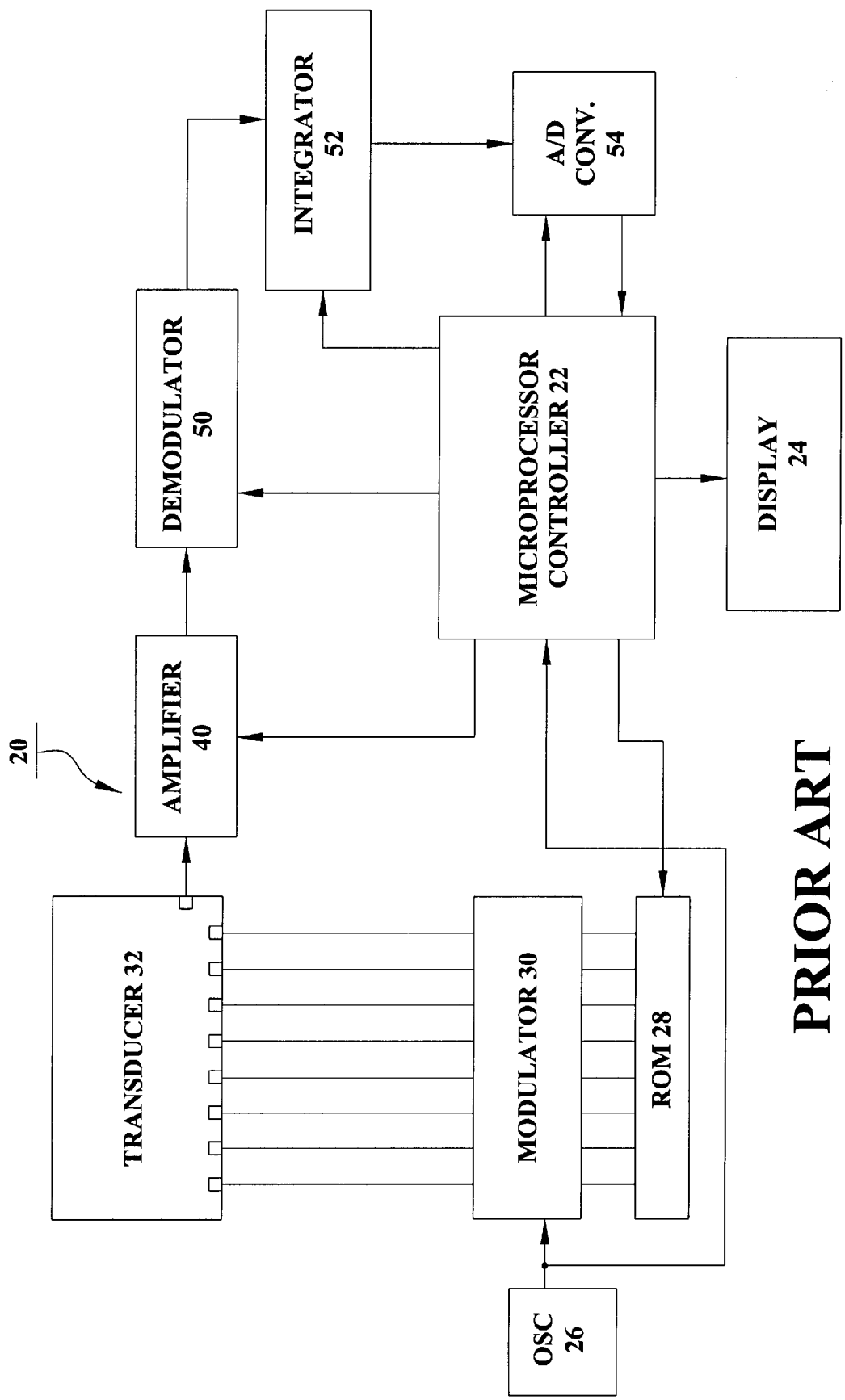
FIG. 1 shows a typical prior art front-end filter implemented by using discrete components.
Figure 2:
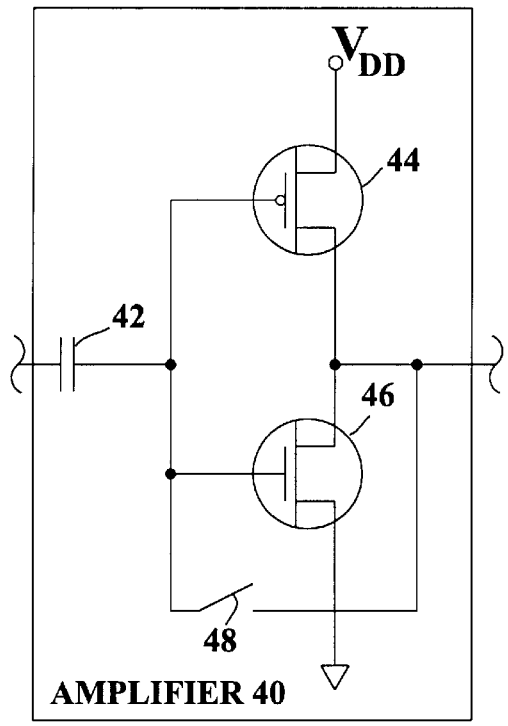
FIG. 2 illustrates a conventional full-wave rectifier with a summer and a lowpass filter (LPF).
Figure 7:
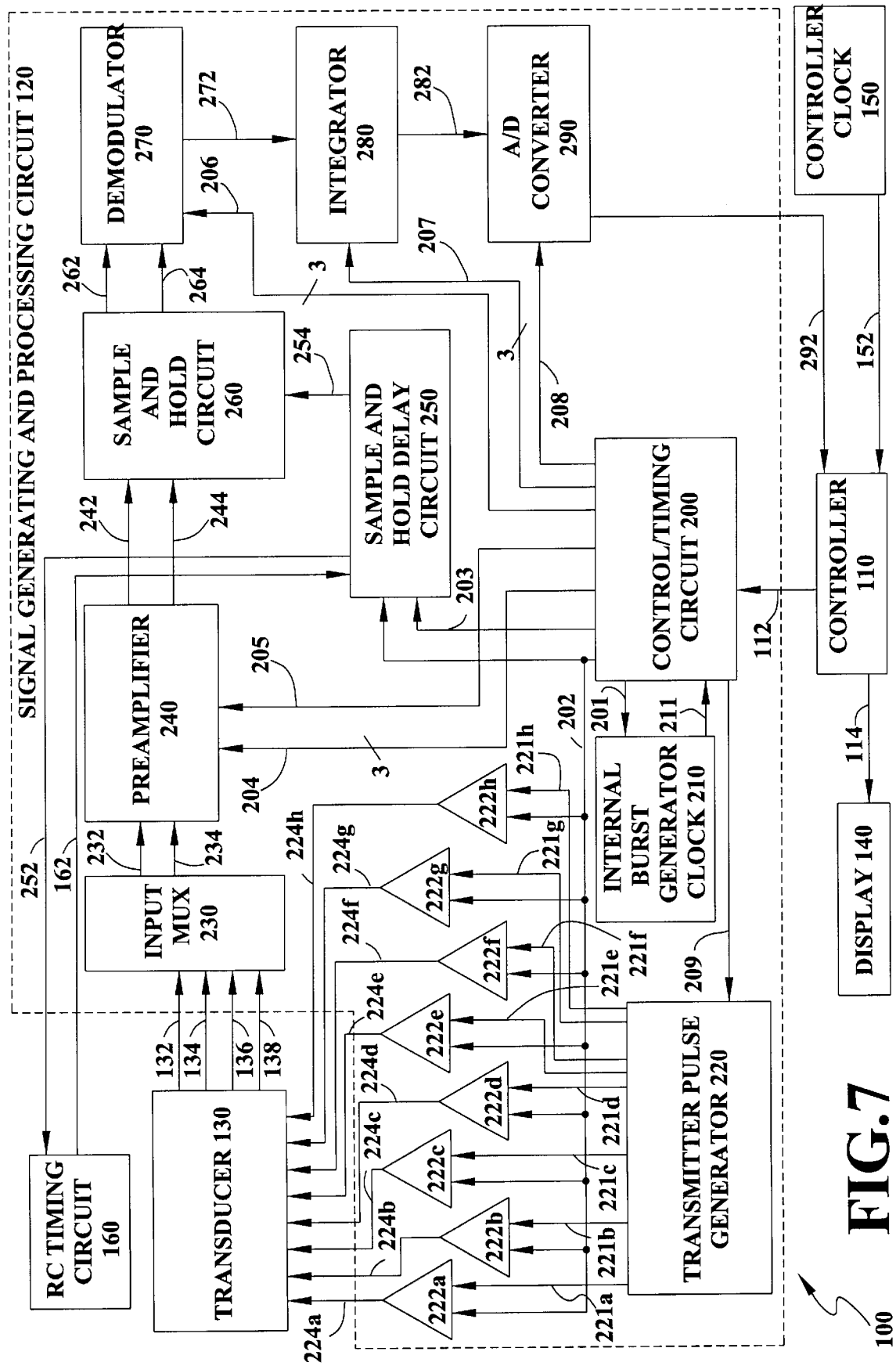
FIG. 7 shows frequency response of the bandpass filter constructed according to the embodiment of FIG. 6.
Figure 8:
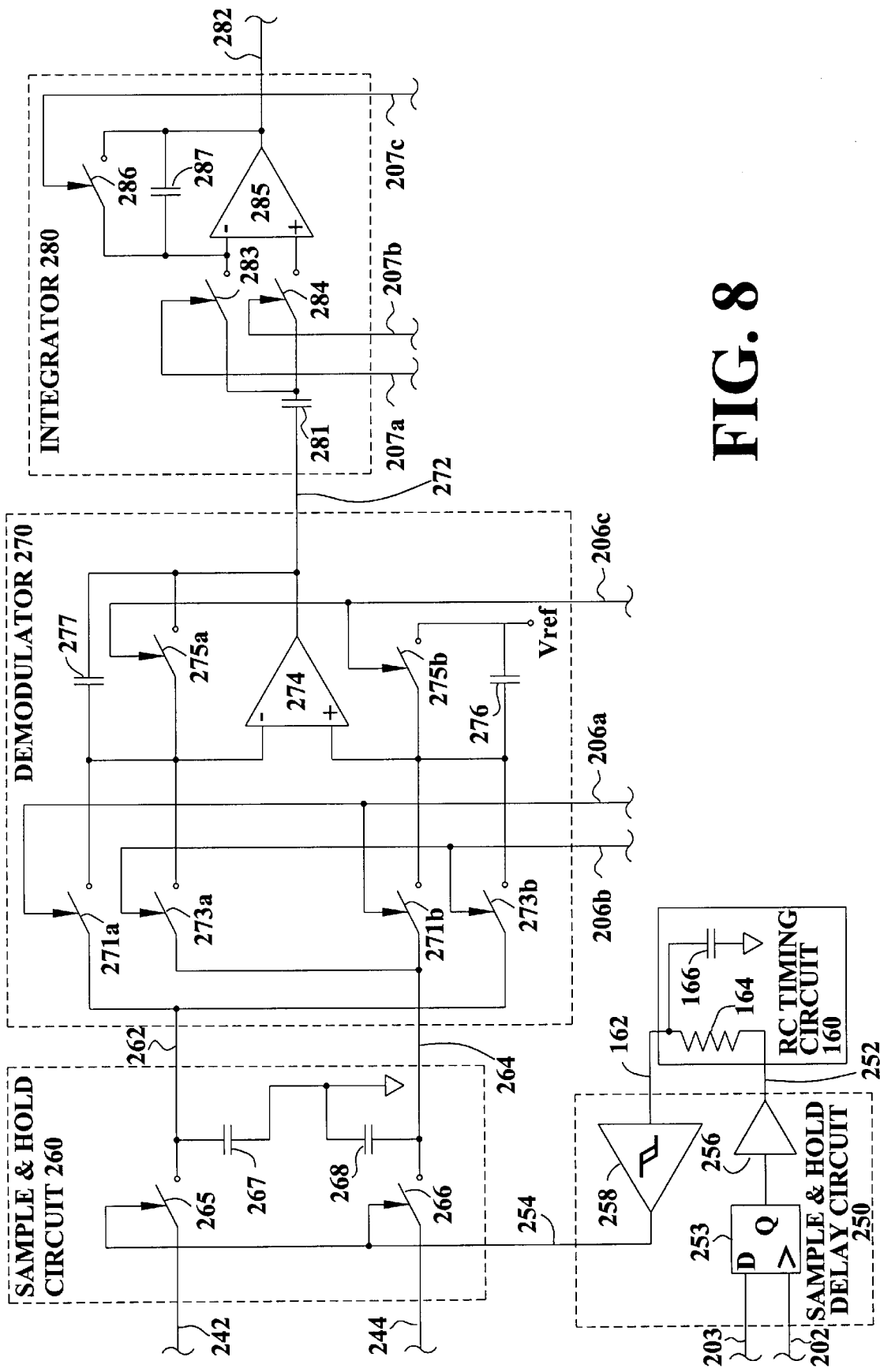
FIG. 8 shows extended frequency response of the bandpass filter constructed according to the embodiment of FIG. 6.

With ideal component values, the frequency response of the bandpass filter shown in FIG. 6 would be as shown in FIG. 7. FIG. 8 is an extended frequency response diagram of FIG. 7. As shown in FIG. 8, the filter provides a substantial gain boost of about 15 dB in passband between 1 KHz and 2.5 KHz and has a rejection band that rejects DC and high-frequency components (over 20 KHz) by more than 30 dB (relative to components in the passband). The gain boost in the selected passband is designed to provide most sensitive shock detection capability around 1 KHz to 2.5 KHz of input signal frequencies. Thus, the integrated high-order filter shown in FIG. 6 provides better high frequency characteristics than prior art discrete component filters such as shown in FIG. 1 and yet requires a minimum number of external capacitors and minimal increase in board space and cost.

Conventionally, on-chip resistors are implemented by polysilicon, p+ diffusion, n+ diffusion, or well, depending upon their applications. When resistors are implemented by polysilicon, or p+ diffusion, or n+ diffusion, or well, they typically are subject to process variations and shows a wide range of tolerance (more than ±30%), thereby shifting the pole and zero locations of the filters significantly. This makes filters with these types of resistors less reliable than desired, and in some cases unacceptable.

Figure 9:
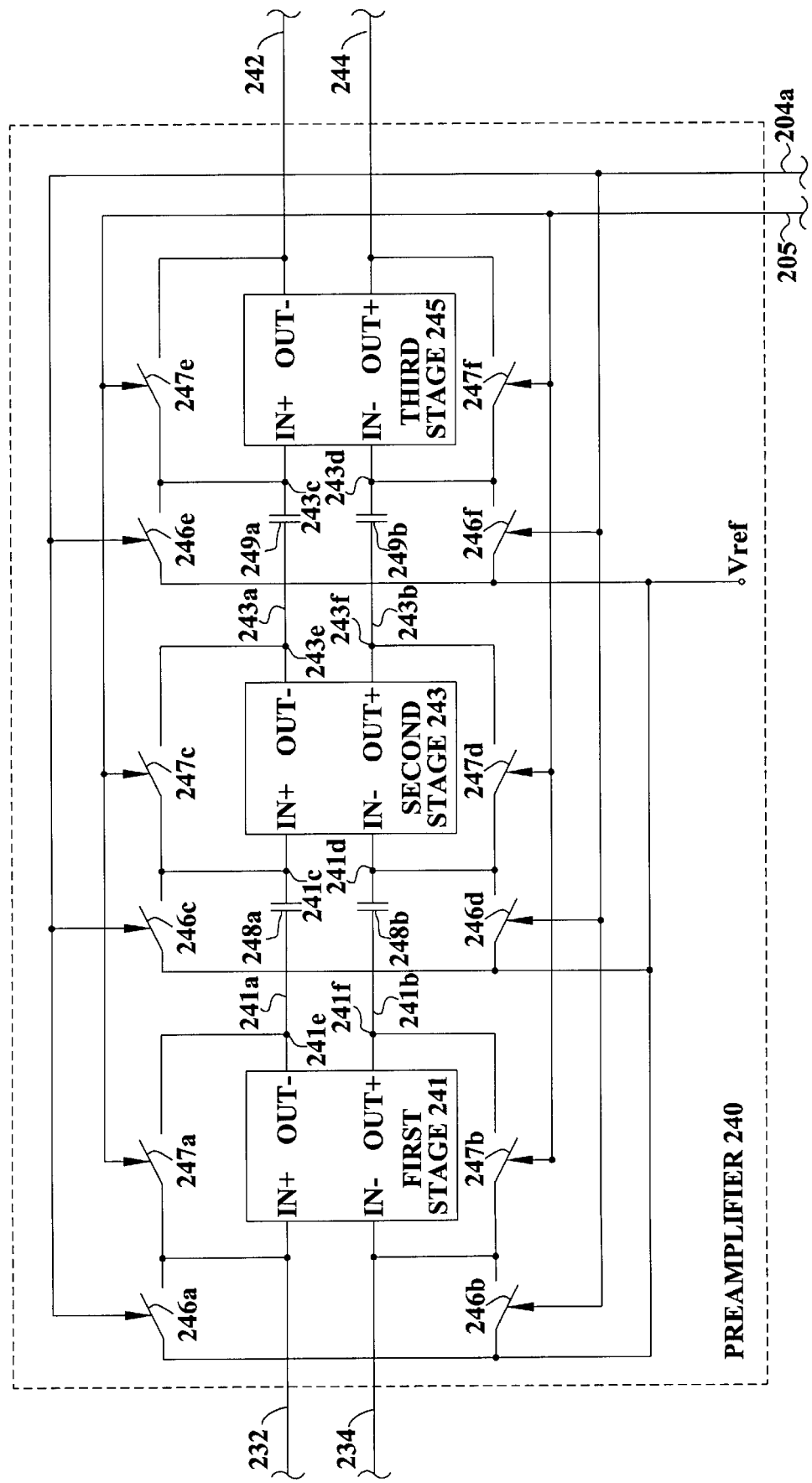
FIG. 9 shows an embodiment of a front-end highpass filter according to the present invention.

Thus, to provide a reliable frequency response, a MOSFET, which is biased in triode region as a linear resistor, is used to implement on-chip resistors in the present invention. Its principle of operation is described referring to FIG. 9. FIG. 9 illustrates a highpass filter constructed according to the present invention.

In FIG. 9, input $V_{IN}$ is coupled to the positive input terminal of amplifier 905 through capacitor 901. The positive input terminal of amplifier 905 is also coupled to reference voltage VR through resistor 903. The negative input terminal of amplifier 905 is coupled to VR through a MOSFET 909 and capacitor 907. MOSFETs Ma,1, Ma,2, ..., Ma,$_{N-1}$ are serially connected between the output terminal of amplifier 905 and the negative input terminal of amplifier 905 with their gates commonly connected to node 913. The gate terminal of MOSFET 909 is also coupled to node 913.

MOSFETs Mb,1, Mb,2, ..., Mb,$_N$ are serially connected between a precision current source $I_B$ and reference voltage VR with their gates commonly connected to node 913. The precision current source $I_B$ is also coupled to the negative input terminal of amplifier 911. The non-inverting input terminal of the amplifier 911 is coupled to a reference voltage equal to (VR+$V_x$) as shown in FIG. 9. The output terminal of the amplifier 911 is coupled to node 913. The dotted lines in FIG. 9 indicate an integrated circuit chip boundary.

The current from the precision current source $I_B$, is forced through a MOSFETs Mb,1, Mb,2, ..., Mb,N which are biased in triode region by a high-gain amplifier 911. The equivalent resistance of the Mb,n is, therefore, the voltage across Mb,n, which is forced to equal to Vx by the high-gain amplifier 911, divided by the current source $I_B$. The Mb,N is then mirrored to implement resistors such as resistors 607 or 609 shown in FIG. 6. The system in FIG. 9 achieves a stable frequency response since both $V_x$ and $I_B$ are fairly stable over process and temperature variations. Also, either the current source or $V_x$, and thus the frequency response of the filter, can be trimmed for further precision or programmed to adjust their values for various HDA design requirements.

A MOSFET biased in triode region as resistor has a fairly large voltage coefficient. In other words, the resistor values of 607 and 609 will somewhat vary with the terminal voltages at the MOSFETs. The voltage coefficient can be minimized if MOSFET is biased in strong triode region and the voltages across MOSFET are limited within ±200 millivolts from its operating point. The HSPICE simulation has proved that the resistor values which are implemented in this manner vary less than ±10% and in most applications, these are acceptable. For applications that require tighter tolerance of resistor values, however, a circuit depicted in FIG. 10 may be used to bias the MOSFETs.

Figure 10:
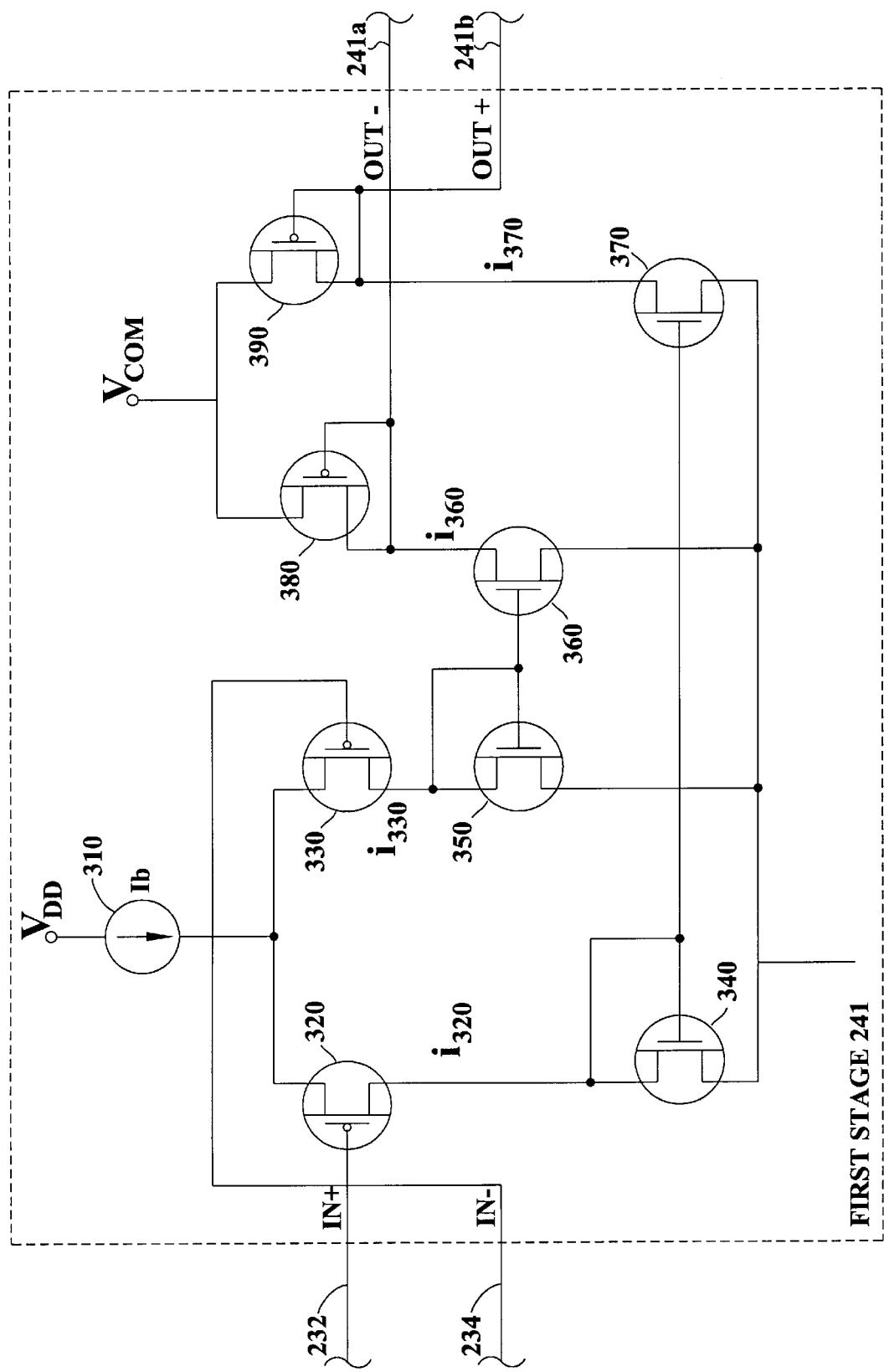
FIG. 10 shows a preferred embodiment of a bias generator according to the present invention.

FIG. 10 shows a diagram of an improved bias generator according to the present invention. In FIG. 10, a current source $I_B$ is coupled to the positive input terminal of amplifier 931, the negative input terminal of which is coupled to (VR+$V_x$). NMOS transistors M1 and M3 are serially coupled between VCC and GND. NMOS transistors M2 and M4 are also serially coupled between VCC and GND. The output terminal of amplifier 931 is coupled to the gates of transistors M1 and M2 as bias voltage $V_B$. The gate of M3 is coupled to the current source $I_B$. PMOS transistors M5 and M6 are connected in parallel between $I_B$ and VR. VR is also coupled to the gate of M4. The gate of transistor M5 is coupled to node 933. The gate of transistor M6 is coupled to node 935. In this configuration shown in FIG. 10, transistors M1, M2, M3 and M4 are biased in saturation region while M5 and M6 are biased in triode region as linear resistors.

FIG. 10 comprises a PMOS resistor element enclosed in dotted lines. Referring to FIG. 10, the biased voltages for both M5 and M6 are such that the drain-to-source voltage drops of M5 and M6 are equal to $V_x$ in the same manner as in FIG. 9. However, in this case, the biased voltages of transistors M5 and M6 are also derived from their terminal voltages since M3 and M4 are source followers with M1 and M2 as current source loads. Thus the circuit eliminates the voltage dependency on terminal voltages of the MOSFET resistor element to the first-order, thereby enhancing the reliability of operation. When used as a resistor element in a circuit, for example to replace resistor 607, 609, 613, 617, or 619 of FIG. 6, the gates of the transistors M3 and M4 are taken and used as two terminals of a resistor element.

Figure 11:
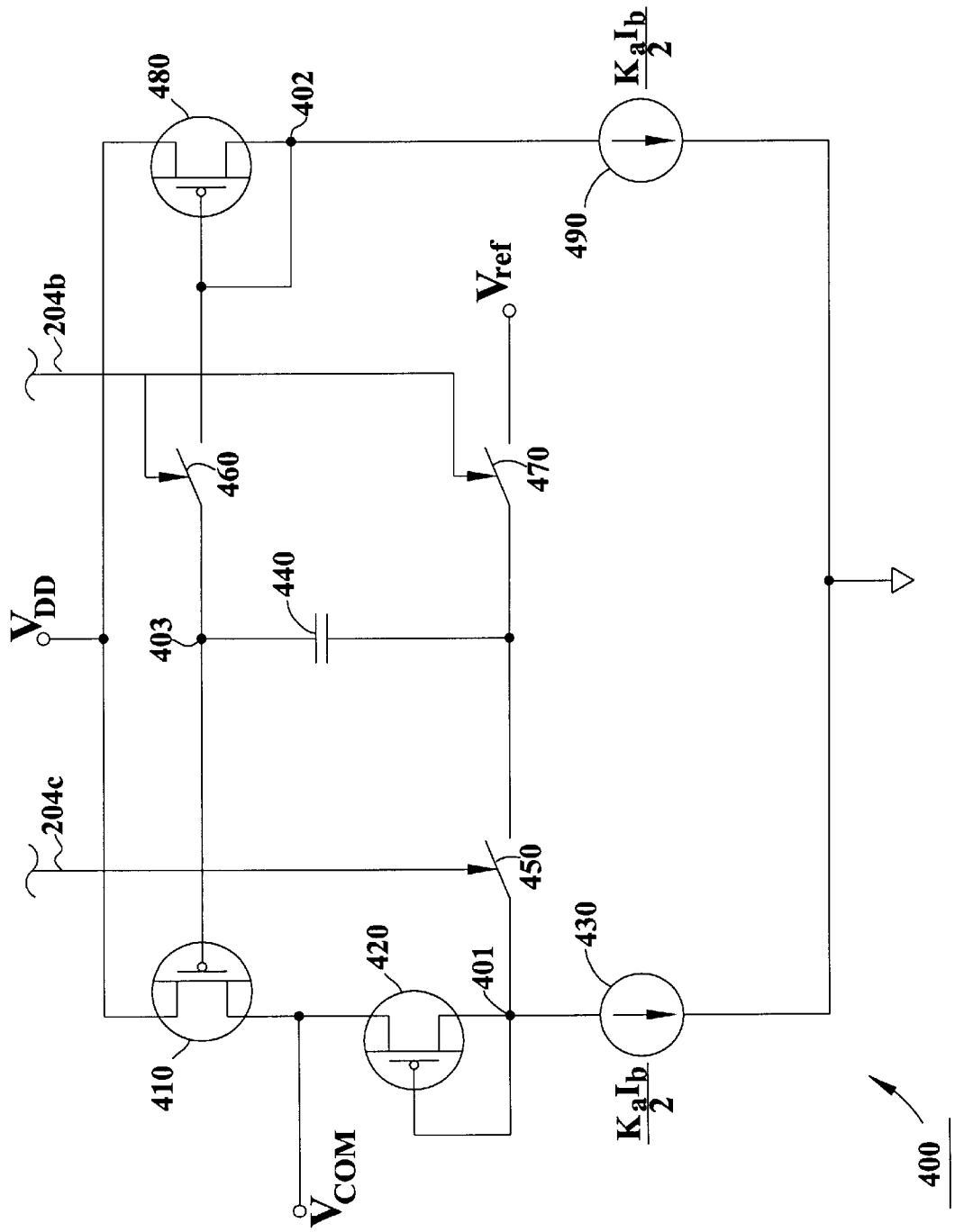
FIG. 11 shows an alternate embodiment of a bias generator according to the present invention.

FIG. 11 shows an alternate embodiment of a bias generator according to the present invention. In FIG. 11, NMOS transistors M11 and M12 are connected in parallel between $I_B$ and VR. The output terminal of amplifier 941 is coupled to the gates of transistors M9 and M10 as bias voltage $V_B$. VR is also coupled to the gate of M8. The gate of transistor M11 is coupled to node 945. The gate of transistor M12 is coupled to node 943.

Referring to NMOS resistor element shown in FIG. 11, the biased voltages for both M11 and M12 are such that the drain-to-source voltage drops of M11 and M12 are equal to $V_x$, as for PMOS resistor of FIG. 10. The NMOS resistor also eliminates the voltage dependency on terminal voltages of the MOSFET resistor element to the first-order. When used as a resistor element in a circuit, for example to replace resistor 607, 609, 613, 617, or 619 of FIG. 6, the gates of the transistors M7 and M8 are taken and used as two terminals of a resistor element.

Thus, either PMOS resistor or NMOS resistor described above can be used alternatively or in combination for precision resistor element depending on applications and IC process characteristics.

Figure 12:
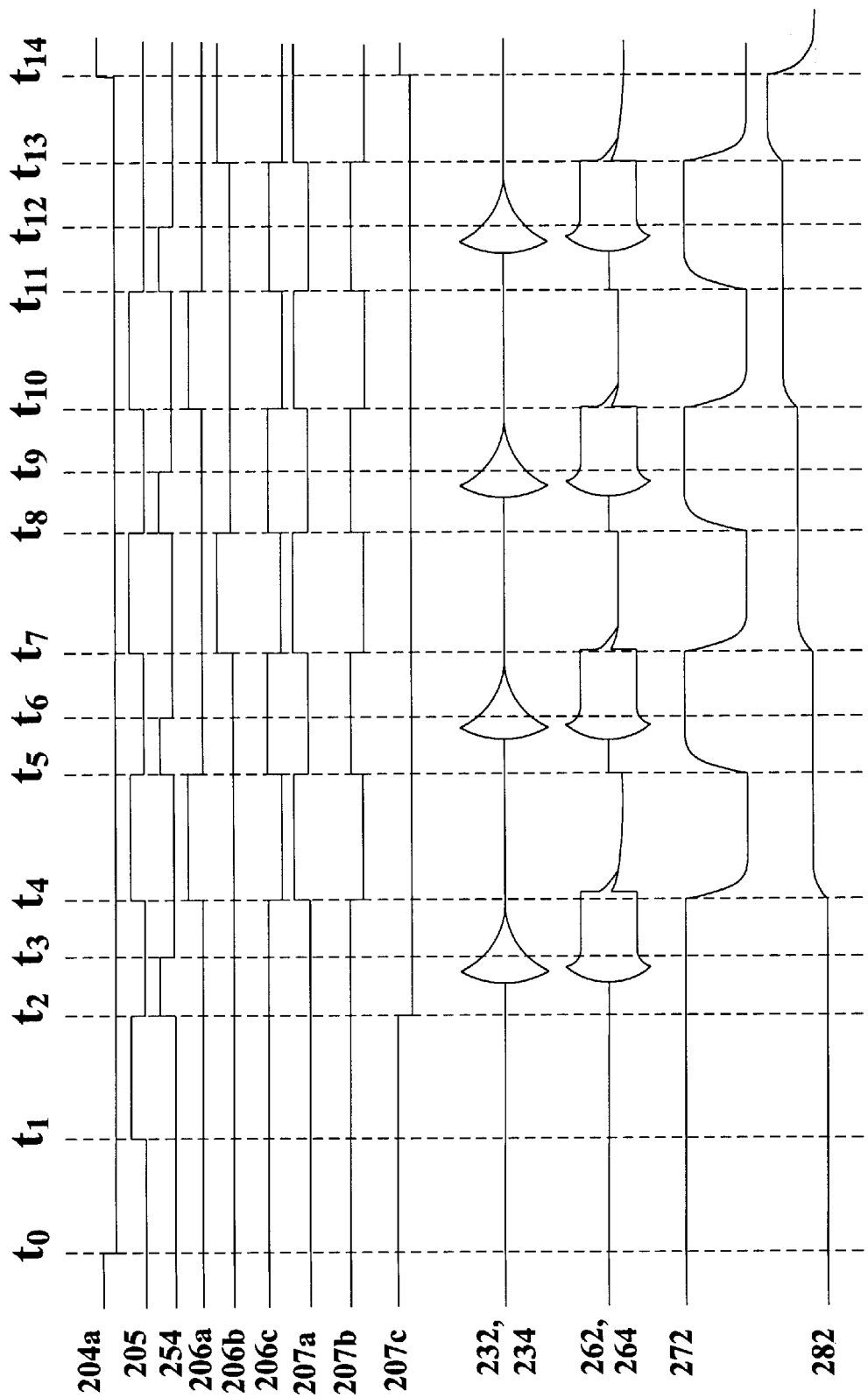
FIG. 12 shows a preferred embodiment of a full-wave rectifier with a summer and an LPF according to the present invention.

FIG. 12 shows a circuit that comprises two-axis full-wave rectifier circuits, a summation circuit and a lowpass filter and is compatible with IC monolithic technology. FIG. 12 comprises an X-axis full-wave rectifier 950 and a Y-axis full-wave rectifier 952. In FIG. 12, X-axis sensor signal VINx is coupled to the negative input terminal of amplifier 951 through resistor R7a. The positive input terminal of amplifier 951 is coupled to VR. MOS transistors M16, M13, M14, M15 are serially connected between VCC and ground. Current source I1 is coupled to the gate of NMOS transistor M13 and the source of PMOS transistor M19, the drain of which is coupled to ground. The source of PMOS transistor M14 is also coupled to the negative input terminal of amplifier 951. The output of amplifier 951 is coupled to the gates of PMOS transistors M14 and M19.

In FIG. 12, VINy is coupled to the negative input terminal of amplifier 953 through resistor R7b. The positive input terminal of amplifier 953 is coupled to VR. NMOS transistor M20 and PMOS transistor M21 are serially connected. The drain of transistor M20 is coupled to the drain of transistor M13. The drain of transistor M21 is coupled to the drain of transistor M15. Current source I2 is coupled to the gate of NMOS transistor M20 and the source of PMOS transistor M22, the drain of which is coupled to ground. The source of PMOS transistor M21 is also coupled to the negative input terminal of amplifier 953. The output of amplifier 953 is coupled to the gates of PMOS transistors M21 and M22.

The drain of NMOS transistor M15 is coupled to its gate, which is also coupled to the gate of NMOS transistor M18. PMOS transistor M17 is coupled between VCC and the gate of transistor M15. The gate of transistor M17 is coupled to the gate of transistor M16. The drain of transistor M18 is coupled to the negative input terminal of amplifier 955 through resistor 959 with its source connected to ground. The positive input terminal of amplifier 955 is coupled to reference voltage VR. Capacitor 957 is coupled between ground and the drain of transistor M18. Resistor 961 is coupled between the output Vout of amplifier 955 and the drain of transistor M18. Capacitor 963 is coupled between the output of amplifier 955 and the negative input terminal of amplifier 955.

Referring to FIG. 12, the input voltage VINx is first converted to a current in either direction by a linear resistor R7a. When the input voltage exceeds VR, a current will flow in the direction of $VIN_x$ towards R7a and through M14. The output of amplifier 951 and thus the gate voltages of M14 and M19 are driven negative so that M14 and M19 are forced on. The gate voltage of M13 is low enough so that M13 is turned off. This current thus flows through $VIN_x$, M14 and M15. M15 is diode-connected and thus mirrors the same amount of the current flowing through M18.

Conversely, when the input voltage is less than VR, a current will flow through M13 towards $VIN_x$. The output of amplifier 951 and thus the gate voltages of M14 and M19 become high enough so that M14 and M19 are forced off and M13 is forced on. This current thus flows through M16 and is mirrored into M17 and through M15. Transistors M16 and M17 constitute a matched-pair current mirror in the same manner as M15 and M18. Therefore, the X-axis full-wave rectifier 950 shown in FIG. 12 generates a current proportional to input voltage magnitude $|VIN_x|$ that flows through M15 irrespective of whether the shock signal is in positive or negative direction.

The Y-axis full-wave rectifier 952 shown in FIG. 12 operates in the same manner and a current proportional to input voltage magnitude $|VIN_y|$ also flows through M15. These two currents from X-axis and Y-axis full-wave rectifiers are added together at M15 and mirrored into M18 and into an operational amplifier through an on-chip RC network, which forms a lowpass filter to reject high-frequency components resulting from full-wave rectification.

The lowpass filter is generally indicated in FIG. 12 at LPF comprising amplifier 955, resistors 959 and 961, and capacitors 957 and 963. The resistors in the RC network can be realized by MOSFETs biased in strong triode region as described above. It is noted that the equivalent resistance value of MOSFET resistor is determined by $V_x$ and $I_B$. By trimming and/or programming different values for $V_x$ and $I_B$, the value of a MOSFET resistor can be adjusted. Transistors M15, M16, M17, and M18 in the preferred embodiment of FIG. 12 are typically operating in saturation region.

The present invention thus provides accurate and reliable shock sensing capability built around a compact system design. As stated above, The advantages of the invention are particularly valuable in HDA applications for portable computers. The advantages of the present invention are:

High-order filter topology meets system requirements closely,

Stable frequency response over temperature, supply voltage and process variations, Minimum number of external bypass capacitors required, Trimmable/programmable frequency response.

Thus, an integrated circuit technology compatible two-axis shock detector system which incorporates a compact integrated high-order filter has been described.

Although the present invention describes and illustrates various embodiments of resistors, rectifiers, and other circuits using MOSFETs, other suitable FETs can also be used to realize the present invention. For example, other thin film materials such as silicon nitride can be used in place of oxide film to form field effect transistors. Depending on design and cost considerations, other insulator thin films are obviously available to form a FET without departing from the scope of the present invention as defined in the appended claims.

It would also be appreciated by those skilled in the art that changes in various details may be made without departing from the invention defined in the appended claims. For example, N-type MOS transistors may be replaced by P-type MOS transistors with appropriate changes in voltage polarities, or vice versa.

Thus, a precision HDA shock sense circuit has been described.

I claim:

1. A circuit for sensing current, said circuit comprising:
    a first bandpass filter including a resistor and a capacitor wherein said resistor comprises FET transistor circuit;
    a first full-wave rectifier coupled to the first bandpass filter;
    a second bandpass filter with a second resistor and a second capacitor;
    a second full-wave rectifier coupled to said second bandpass filter; and
    a summation circuit coupled to said first and second full-wave rectifiers, wherein said FET transistor circuit comprises:
        a first FET (Field Effect Transistor) and a second FET coupled in series;
        a third FET and a fourth FET coupled in series;
        a fifth FET and a sixth FET coupled in parallel between gates of the first FET and the third FET;
        a bias voltage coupled to gates of the second FET and the fourth FET;
        a gate of the fifth FET coupled to a terminal of a channel of the second FET;
        a gate of the sixth FET coupled to a terminal of the channel of the fourth FET; and
        a gate of the first FET and a gate of the third FET being used as resistor terminals.

2. The circuit of claim 1 wherein said first bandpass filter comprises:
    a lowpass filter; and
    a highpass filter comprising:
        an amplifier, a positive input terminal of the amplifier coupled to an input signal;
        a first plurality of FETs coupled in series between a negative input terminal and an output terminal of the amplifier;
        an FET coupled between a first supply voltage and the negative input terminal of the amplifier;
        a current source;
        a second amplifier, a positive input terminal of the second amplifier coupled to a second supply voltage, a negative input terminal of the second amplifier coupled to the current source;
        a second plurality of FETs coupled in series between the current source and the first voltage supply; and
        gates of said FET and said first and second plurality of FETs coupled to an output terminal of the second amplifier.

3. A circuit for sensing current, said circuit comprising:
    a first bandpass filter including a resistor and a capacitor;
    a first full-wave rectifier coupled to the first bandpass filter;
    a second bandpass filter with a second resistor and a second capacitor;
    a second full-wave rectifier coupled to said second bandpass filter; and
    a summation circuit coupled to said first and second full-wave rectifiers wherein said first full-wave rectifier circuit comprises:
        a current source;
        an amplifier coupled to the current source;
        a first FET and a second FET coupled in series between a first node and a second node;
        a third FET coupled between the current source and ground;
        a gate of the first FET is coupled to the current source;
        an output terminal of the amplifier is coupled to gates of the second and third FET.

4. The circuit of claim 3 wherein said second full-wave rectifier circuit comprises:
    a second current source;
    a second amplifier coupled to the second current source;
    a fourth FET and a fifth FET coupled in series between the first node and the second node;
    a sixth FET coupled between the second current source and ground;
    a gate of the fourth FET is coupled to the second current source;
    an output terminal of the second amplifier is coupled to gates of the fifth and sixth FET.

5. The circuit of claim 4 further comprising a current mirror circuit comprising:
    a seventh FET, a terminal of the channel of the seventh FET coupled to said first node, a gate of the seventh FET coupled to said first node;
    an eighth FET coupled to said second node, a gate of the eighth FET coupled to said second node; and
    a ninth FET coupled to the eighth FET.

6. The circuit of claim 5 further comprising a lowpass filter comprising:
    a third amplifier;
    a third resistor and a third capacitor coupled in parallel between a negative input terminal of said third amplifier and an output of said third amplifier; and
    a tenth FET coupled between the negative input terminal of said third amplifier and ground, a gate of the tenth FET is coupled to the eighth FET.

7. A circuit for sensing current, said circuit comprising:
    a first full-wave rectifier;
    a summation circuit coupled to said first full-wave rectifier and a second full-wave rectifier for summing outputs of the first and second full-wave rectifiers; and
    a bandpass filter coupled to the first full-wave rectifier, said bandpass filter comprising:
        an amplifier;
        a resistor circuit coupled to said amplifier, said resistor circuit comprising:
            a first FET and a second FET coupled in series;
            a third FET and a fourth FET coupled in series;
            a fifth FET and a sixth FET coupled in parallel between gates of the first FET and the third FET;
            a bias voltage coupled to gates of the second FET and the fourth FET;
            a gate of the fifth FET coupled to a terminal of a channel of the second FET;
            a gate of the sixth FET coupled to a terminal of a channel of the fourth FET; and a gate of the first FET and a gate of the third FET being used as resistor terminals.

8. The circuit of claim 7 wherein said first full-wave rectifier comprises:

a current source, a second amplifier coupled to the current source;

a first FET and a second FET coupled in series between a first node and a second node;

a third FET coupled between the current source and ground;

a gate of the first FET is coupled to the current source;

an output terminal of the second amplifier is coupled to gates of the second and third FET.

9. The circuit of claim 8 further comprising a second bandpass filter and said second full-wave rectifier coupled to said second bandpass filter, said second full-wave rectifier comprising:

a second current source;

a third amplifier coupled to the second current source;

a fourth FET and a fifth FET coupled in series between the first node and the second node;

a sixth FET coupled between the second current source and ground;

a gate of the fourth FET being coupled to the second current source;

an output terminal of the third amplifier is coupled to gates of the fifth and sixth FET.

10. The circuit of claim 9 further comprising a current mirror circuit comprising:

a seventh FET, a terminal of a channel of the seventh FET coupled to said first node, a gate of the seventh FET coupled to said first node;

an eighth FET, a terminal of the channel of the eighth FET coupled to said second node; and a ninth FET coupled to the eighth FET.

11. The circuit of claim 10 further comprising a lowpass filter comprising:

a fourth amplifier;

a resistor and a capacitor coupled in parallel between a negative input terminal and an output of said fourth amplifier; and a tenth FET coupled between the negative input terminal of said fourth amplifier and ground.

12. The circuit of claim 11 is integrated on a single chip.

13. A circuit for sensing current, said circuit comprising:

a first bandpass filter comprising:
an amplifier;
a first resistor circuit coupled to said amplifier;

a first full-wave rectifier coupled to said bandpass filter, said first full wave rectifier comprising:

a current source;

a second amplifier coupled to the current source;

a first FET and a second FET coupled in series between a first node and a second node;

a third FET coupled between the current source and ground;

a gate of the first FET coupled to the current source;

an output terminal of the second amplifier coupled to gates of the second and third FET;

a second bandpass filter comprising:

a third amplifier;

a second first resistor circuit coupled to said third amplifier;

a second full-wave rectifier coupled to said second bandpass filter, said second full-wave rectifier comprising:

a second current source;

a fourth amplifier coupled to the second current source;

a fourth FET and a fifth FET coupled in series between the first node and the second node;

a sixth FET coupled between the second current source and ground;

a gate of the fourth FET coupled to the second current source;

an output terminal of the fourth amplifier coupled to gates of the fifth and sixth FET; and a summation circuit coupled to said first and second full-wave rectifiers for summing outputs of the first and second full-wave rectifiers.

14. The circuit of claim 13 wherein said first resistor circuit comprising:

a seventh FET and an eighth FET coupled in series;

a ninth FET and a tenth FET coupled in series;

a eleventh FET and a twelfth FET coupled in parallel between gates of the seventh FET and the ninth FET;

a bias voltage coupled to gates of the eighth FET and the tenth FET;

a gate of the eleventh FET coupled to a terminal of a channel of the eighth FET;

a gate of the twelfth FET coupled to a terminal of a channel of the tenth FET; and a gate of the seventh FET and a gate of the ninth FET being used as resistor terminals.

15. The circuit of claim 14 further comprising a current mirror circuit coupled to the summation circuit wherein a current proportional to an output of the summation circuit is provided as an output from the current mirror circuit.

16. The circuit of claim 15 further comprising a lowpass filter coupled to the output of the current mirror circuit.

17. The circuit of claim 16 is integrated on a single chip.

* * * * *